US 6,710,811 B1

(12) United States Patent
Lin et al.

(10) Patent No.: US 6,710,811 B1
(45) Date of Patent: Mar. 23, 2004

(54) DATA PROCESSING DEVICE

(75) Inventors: Jinan Lin, Ottobrun (DE); Maximilian Erbar, Villingen-Schwenningen (DE)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/674,696

(22) PCT Filed: Apr. 28, 1999

(86) PCT No.: PCT/EP99/02878

§ 371 (c)(1),
(2), (4) Date: Feb. 16, 2001

(87) PCT Pub. No.: WO99/59336

PCT Pub. Date: Nov. 18, 1999

(30) Foreign Application Priority Data

May 9, 1998 (DE) .......................... 198 20 909

(51) Int. Cl.⁷ .......................... H04N 7/00; H04N 7/087;
H04N 11/00; H04N 5/21; H04N 5/213;
H04N 5/217; H03H 7/30; H03H 7/40; H04B 1/66

(52) U.S. Cl. .................. 348/465; 348/466; 348/468;
348/478; 348/611; 348/618; 375/232; 375/340

(58) Field of Search ........................ 348/465, 466,
348/468, 478, 611, 618; 375/340, 337,
229, 232, 316, 317

(56) References Cited

U.S. PATENT DOCUMENTS

| 4,318,128 | A |   | 3/1982  | Sauvanet ............... 358/147    |
| 4,322,811 | A | * | 3/1982  | Voorman ................ 708/819    |
| 4,333,109 | A | * | 6/1982  | Ciciora ................. 348/466   |
| 4,433,425 | A | * | 2/1984  | de Jaeger ............... 375/364   |
| 4,449,145 | A |   | 5/1984  | Ciciora ................. 358/147   |
| 4,667,235 | A | * | 5/1987  | Nozoe et al. ............ 348/464   |
| 5,136,382 | A | * | 8/1992  | Meyer ................... 348/465   |
| 5,371,548 | A |   | 12/1994 | Williams ................ 348/478   |
| 5,493,585 | A | * | 2/1996  | Leverington et al. ..... 375/232    |
| 5,561,469 | A | * | 10/1996 | Schultz ................. 348/476   |
| 5,596,372 | A |   | 1/1997  | Berman et al. .......... 348/537    |
| 5,654,764 | A | * | 8/1997  | Suh .................... 348/468    |
| 5,657,088 | A | * | 8/1997  | Hankinson .............. 348/465    |
| 5,666,167 | A | * | 9/1997  | Tults .................. 348/465    |
| 5,841,810 | A | * | 11/1998 | Wong et al. ............ 375/232    |
| 5,995,157 | A | * | 11/1999 | Retter et al. .......... 348/525    |
| 6,462,782 | B1| * | 10/2002 | Honda et al. ........... 348/465    |

FOREIGN PATENT DOCUMENTS

| EP | 0152309 B1 | 2/1985 | .......... H04N/7/093 |
| GB | 2094104    | 9/1982 | .......... H04L/13/18 |
| WO | 93/18614   | 9/1993 | ............ H04N/7/00|

* cited by examiner

*Primary Examiner*—Michael H. Lee
*Assistant Examiner*—Paulos M. Natnael
(74) *Attorney, Agent, or Firm*—Joseph S. Tripoli; Joseph J. Laks; Ronald H. Kurdyla

(57) ABSTRACT

The invention relates to a data processing device for recovering digital data which is received in an analogue transmitted signal. According to the invention, the received signal is digitized and a threshold is determined in a threshold estimator. The interference in the channel is corrected in a downstream adaptive equalizer, and a bit clock generator produces the correct sampling rate and phase for the data of a line. The threshold estimator is used to determine the mean value of an input signal for each line, and this value is then taken as the optimum decision value for sampling the data bits for this line. By using an adaptive equalizer, it is possible to correct different types of distortion, caused by the transmission channel, without the need for a training signal. The data processing device according to the invention can thus be used universally for all digital additional signals occurring in a television signal, for example.

5 Claims, 11 Drawing Sheets

DATA PROCESSING DEVICE

The invention relates to a data processing device for recovering digital data which is received in an analogue transmitted signal.

PRIOR ART

Digital data transmitted with an analogue television signal, such as Teletext, a VPS signal or a WSS signal, is corrupted by the transmission channel owing to its low-pass filtering effect, for example. The digital data is then reconstructed in a receiver by thresholding. The output of a conventional data processing device then provides a digital data stream which is supplied to a downstream decoder for error correction, interpretation of the data and grouping the bits into bytes.

A conventional data processing device using thresholding is only inadequately able to correct corruption caused by a transmission channel. Hence, the interpretation in the downstream decoder is incorrect or individual sections of data are not decoded, so that visible errors are shown on the screen. The data efficiency thus depends on the transmission channel.

INVENTION

The invention is based on the object of specifying a data processing device which guarantees a high data efficiency for the reception of digital data in an a analogue signal via transmission channels of various quality.

The invention achieves this object with the features specified in claim 1.

Advantageous developments are described in the subclaims.

According to the invention, the received signal is digitized and a threshold is determined in a threshold estimator. The interference in the channel is corrected in a downstream adaptive equalizer, and a bit clock generator produces the correct sampling rate and sampling phase for the data for a line.

The threshold estimator is used to determine the mean value of an input signal for each line, and this value is then taken as the optimum decision value for sampling the data bits for this line.

By using an adaptive equalizer, it is possible to correct different types of distortion, caused by the transmission channel, without the need for a training signal. The data processing device according to the invention can thus be used universally for all digital additional signals occurring in a television signal, for example.

The bit clock generator produces the correct sampling rate for recovering the data and adjusts itself to the optimum sampling phase.

The adaptive equalizer improves the data processing device by making it insensitive to channel interference. In addition, a data rate converter is preferably connected downstream of the adaptive equalizer, whose outputs have the correct data signals and the correct clock signal for decoding the data for a line.

To keep the mean value provided by the threshold estimator for a line constant, a clamping circuit may also be provided.

This clamping circuit can then have a scaling device connected downstream in order to provide the adaptive equalizer with a signal amplitude having a suitable dynamic range.

As a preference, it is additionally possible for a decision device to be used which releases only processible data for the adaptive equalizer. In addition, this decision device supplies the scaling device with a correct scaling factor and also checks the mean value of the threshold estimator before it is supplied to the clamping circuit.

A further embodiment of the invention involves the use of a black-level estimator which estimates the black level of every line, this black level then being used as a reference value for the threshold estimator and for the decision device.

To reduce the influence of interference signals, an input low-pass filter is preferably used.

DRAWINGS

An exemplary embodiment of the data processing device according to the invention is furthermore described with reference to the drawings, in which.

EXEMPLARY EMBODIMENTS

Figure 1:
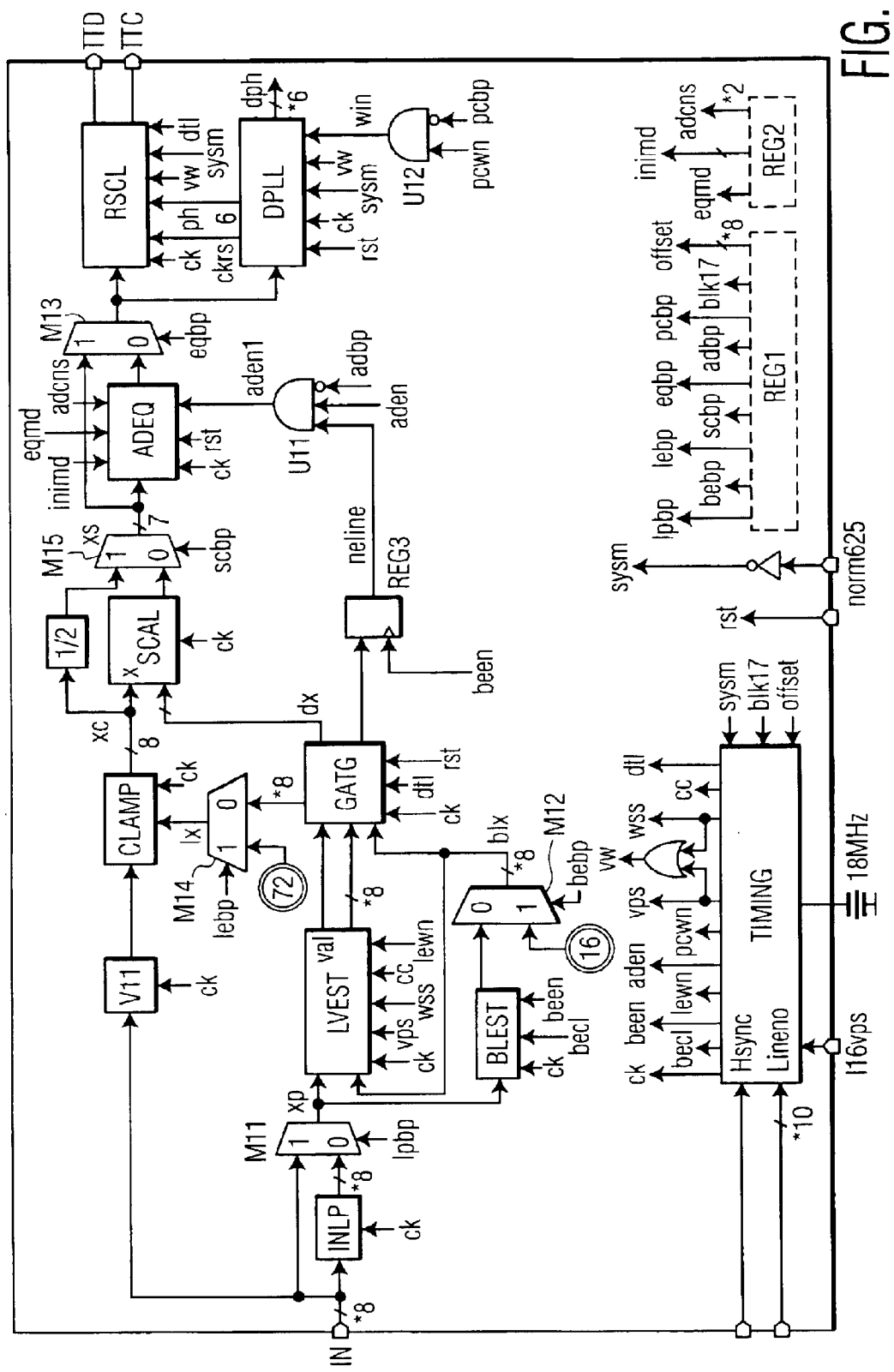
FIG. 1 shows a data processing device.

FIG. 1 shows a schematic illustration of a data processing device having an input IN, to which the digitized received data is supplied, as well as a data output TTD and a clock output TTC.

The digital input data provided has a resolution of 8 bits and a data rate of 18 MHz sampling rate for PAL/SECAM and 9 MHz for NTSC. The corresponding A/D converter is not shown. The data lines marked by a "*" are unsigned data lines.

A register REG1 can store values, depending on the decoding result, which represent possible bypass values for appropriate modules of the data processing device.

Hence, a bypass value lpdp can be used to bypass an input low-pass filter INLP through a multiplexer M11, a bypass value bebp can be used to bypass a black-level estimator BLEST through a multiplexer M12, a value lebp can be used to bypass a threshold estimator LVEST through a multiplexer M14, a value scbp can be used to bypass a scaling device SCAL through a multiplexer M15, and a value eqbp can be used to bypass an adaptive equalizer ADEQ through a multiplexer M13. A bypass value adbp can be used to influence the function of the adaptive equalizer ADEQ on a line-by-line basis, and a bypass value pcbp can be used to influence the function of a bit clock generator DPLL on a line-by-line basis. A value blk17 is used to identify non-standard applications of the television lines 17–18, and the last 8 cells of the register REG1 store an offset value offset in accordance with the current standard.

A second register REG2 can be used to store a value adcns which serves as an adaptation constant for the adaptive equalizer ADEQ. The larger the value, the faster the adaptation.

A value inimd is used to define an initialization mode, and a value eqmd is used to define a mode of operation for the adaptive equalizer ADEQ.

The input data is preferably supplied via the input low-pass filter INLP to an input of the threshold estimator LVEST and possibly to the black-level estimator BLEST.

A timer TIMING supplies the processing clocks required for processing the digital input data. To this end, the timer TIMING is supplied with a horizontal sync signal Hsync, a line number signal Lineno, an information signal 116vps, which is set whenever the 16th line in a European TV system is a VPS line, a clock signal sysm, the value blk17 and the offset value offset.

The offset value offset is 8 bits long and is required to compensate for any delays between the horizontal sync signal Hsync and a video input signal at the input IN. The offset value offset is calculated on the basis of Offset=100−Δ for a European system or Offset=50−Δ for an American system. Here, Δ is equal to the number of samples for the delay caused by the horizontal sync signal Hsync. This means that the permitted delay for the horizontal sync signal Hsync can be (−155, 100)/18 ($\mu$s) for a European system and (−205, 50)/9 ($\mu$s) for an American system.

The output signals from the timer TIMING are a clock signal ck, a reset signal becl and an enable signal been for the black-level estimator BLEST, a window signal lewn for the threshold estimator LVEST, an enable signal aden for the adaptive equalizer ADEQ, a phase-correction window signal pcwn and a signal vw, if either a signal vps or a signal wss is present, for the bit clock generator DPLL, a data line signal dtl, and a signal vps if a video programming signal is present, a signal wss if widescreen signalling is present, and a signal cc for a closed-caption signal.

The timer TIMING supplies the threshold estimator LVEST with the clock signal ck, the signal vps, the signal wss, the signal cc and the signal lewn. The black-level estimator BLEST is supplied with the clock signal ck, the reset signal becl and the enable signal been. The 8-bit-wide output of the black-level estimator BLEST is connected via a multiplexer M12 both to a second input of the threshold estimator LVEST and to an input of a decision device GATG, to which the timer TIMING applies the clock signal ck, the signal dt1 and an external reset signal rst.

A second input, which is likewise 8 bits wide, of the decision device GATG is connected to an output of a threshold estimator LVEST. An enable signal val from the threshold estimator LVEST controls the decision device GATG. An output of the decision device GATG is connected to a clamping circuit CLAMP. The 8-bit-wide output of the threshold estimator LVEST can also be connected directly to the clamping circuit CLAMP or to a scaling device SCAL, bypassing the decision device GATG to do so. The black-level estimator BLEST is also advantageous to the output of the data processing device, but is not absolutely essential.

The signal delay times caused by the input low-pass filter INLP, the threshold estimator LVEST and the decision device GATG are preferably compensated for by a delay circuit V11. The digital input signal IN is thus supplied to an input of the clamping circuit CLAMP after being delayed by the delay circuit V11.

A second output dx of the decision device GATG is connected to a second input of the scaling device SCAL. The output of the scaling device SCAL is 7 bits wide and is connected to the input of an adaptive equalizer ADEQ via a multiplexer M15. The multiplexer M15 has a control input for a bypass value scbp. Whenever the bypass value scbp is set, the input of the scaling device SCAL is connected directly to the adaptive equalizer ADEQ.

A third output of the decision device GATG is connected to a first input of a register REG3, whose second input has the signal been from the timer TIMING applied to it. If a line is not free of data, a signal neline is produced. The signal neline, together with the signals aden and adbp, is the input signal for an AND gate U11, the input for the signal adbp being inverted. The output signal from the AND gate U11 is an enable signal aden1 for the adaptive equalizer ADEQ.

Other control inputs of the adaptive equalizer ADEQ have the signals inimd, eqmd, adcns, rst and ck applied to them.

The output of the adaptive equalizer ADEQ is connected both to a data rate converter RSCL and to a bit clock generator DPLL. The bit clock generator DPLL has applied to it the signals rst, ck, sysm, which is derived from a signal norm625, vw, and a signal win, produced from the signals pcwn and pcbp (which is inverted) by means of an AND gate U12.

Data lines ph and a signal ckrs produced by the bit clock generator DPLL are connected/supplied from the bit clock generator DPLL to the data rate converter RSCL. Further data lines from the bit clock generator DPLL carry signals dph. Further inputs of the data rate converter RSCL have the signals ck, vw, sysm and dtl applied to them.

Figure 2:
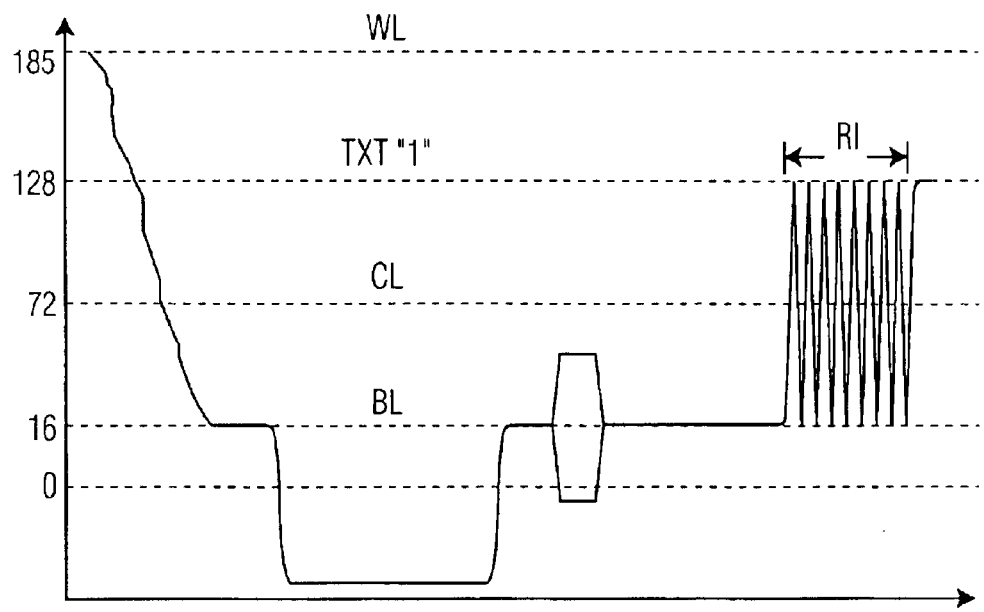
FIG. 2 shows the input signal form of a Teletext line.

FIG. 2 shows the input signal form of a Teletext line. In this case, the black level BL is established at the value 16 and the white level WL is established at the value 185.

An input signal RI defines the text value 1 for a value TXT "1" of 128 for the subsequent digital data, and the text value 0 for the black level BL of 16. The decision threshold CL occurs at a value of 72, in the middle between the value 128 and the value 16.

Figure 3:
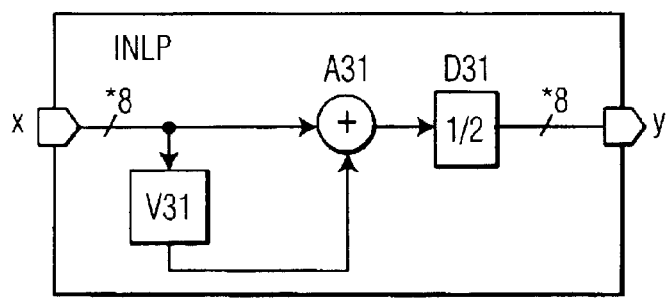
FIG. 3 shows an input low-pass filter.

FIG. 3 shows an exemplary embodiment of the digital input low-pass filter INLP. The input data x is supplied to a first input of an adder A31 and, having been delayed by one clock cycle by a delay stage V31, is supplied to a second input of the adder A11. The output signal from the adder A11 is fed through a divider D31, which is preferably designed as a shift register, to the output y of the input low-pass filter INLP.

Figure 4:
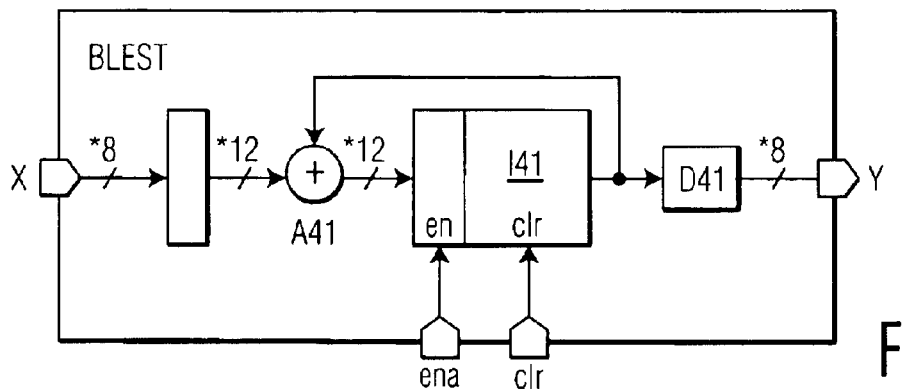
FIG. 4 shows a black-level estimator.

FIG. 4 shows an exemplary embodiment of the black-level estimator BLEST. The input data is passed from the input x to an MSB-adding device MSB41. An 8-bit input signal having a value of, for example, 1000 0000 is used to produce a 12-bit output value 1111 1000 0000. This output value is fed to an adder A41, whose output value is fed to an integrator I41. An enable input ena switches on the integrator I41 over the time period in which the black level BL shown in FIG. 2 is present in the signal. When integration has finished and before a fresh black-level estimation starts, the integrator I41 is reset by a reset signal clr. The output of the integrator I41 is supplied both to the second input of the adder A41 and to a divider D41, which produces an 8-bit value. This 8-bit value is then obtained at the output y of the black-level estimator BLEST.

Figure 5:
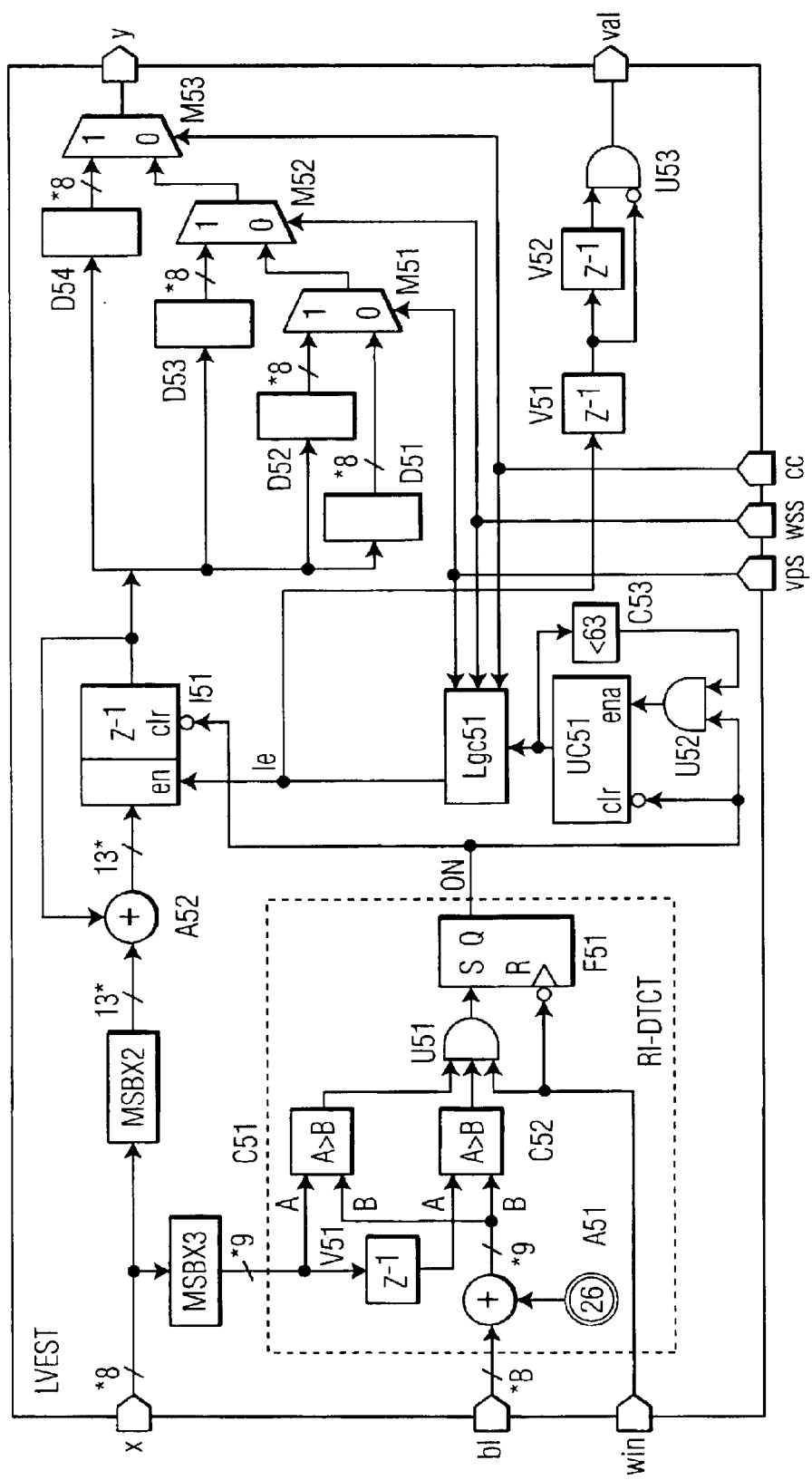
FIG. 5 shows a threshold estimator.

FIG. 5 shows an exemplary embodiment of the threshold estimator LVEST.

The threshold estimator LVEST has 3 inputs. A first input x is supplied with the data from the input low-pass filter INLP, for example. A second input b1 is supplied with the output value from the black-level estimator BLEST, and a third input is supplied with the window signal win from the timer TIMING.

The input x is connected to an MSB extender MSBX3 on the one hand and to an MSB extender MSBX2. The input line is an unsigned 8-bit line. The output of the MSB extender MSBX3 is an unsigned 9-bit line and the output of the MSB extender MSBX2 is an unsigned 13-bit line. The output of the MSB extender MSBX3 is connected to an A-input of a comparator C51 on the one hand and to an A-input of a comparator C52 via a delay circuit V51. The input bl is connected to a respective B-input of the comparators C51, C52 via an adder A51, whose second input has a constant 26 applied to it. The outputs of the comparators C51, C52 and the input win are connected to a respective input of an AND gate U51. The output of the AND gate U51 is connected to the S-input of a flip-flop F51, whose inverted R-input is connected to the input win. The Q-output of the flip-flop F51 is a reset signal clr for an integrator I51 and an up-counter UC51. In addition, the Q-output of the flip-flop F51 is also connected to an input of an AND gate U52.

The circuit components comprising the comparators C51, C52, delay circuit V51, AND gate U51 and flip-flop F51 form a run-in detector RI-DTCT.

The output of the MSB extender MSBX2 is connected to an adder A52, whose output is connected to the input of the integrator I51. The output of the integrator I51 is connected to the second input of the adder A52 on the one hand and to a respective input of a divider D51, a divider D52, a divider D53 and a divider D54 on the other. The divider D51 preferably has a division ratio of 39/1024, the divider D52 preferably has a division ratio of 35/1024, the divider D53 preferably has a division ratio of 47/1024 and the divider D54 preferably has a division ratio of 57/1024. The outputs of the dividers D51, D52, D53 and D54 are unsigned 8-bit lines. The outputs of the divider D51 are connected to a 0-input of a multiplexer M51, whose 1-input is connected to the outputs of the divider D52. The outputs of the divider D53 are connected to a 1-input of a multiplexer M52, whose 0-input is connected to the outputs of the multiplexer M51. The outputs of the divider D54 are connected to a 1-input of a multiplexer M53, whose 0-input is connected to the outputs of the multiplexer M52. The outputs of the multiplexer M53 are connected to an output y of the threshold estimator LVEST.

The counting input ena of the up-counter UC51 is connected to the output of the AND gate U52. The output of the up-counter UC51 is connected to a logic circuit Lgc51 on the one hand and to a comparator C53, whose output is connected to the second input of the AND gate U52. The logic circuit Lgc51 has control lines connected to it, the said control. lines having the VPS signal vps, the WSS signal wss and the close-caption signal cc applied to them. The control lines are additionally connected to a respective control input of the multiplexers M51, M52, M53, in that order. The logic circuit Lgc51 provides at its output a signal le, which is an enable signal for the integrator I51 and is fed to a delay circuit V51 at the same time. The output of the delay circuit V51 is connected to a delay circuit V52 on the one hand and to an inverted input of an AND gate U53, whose second input is connected to the output of the delay circuit V52. The output of the AND gate U53 is the output val of the threshold estimator LVEST.

The main part of the threshold estimator LVEST is the integrator I51, which is used as a mean-value filter. In addition, the run-in detector RI-DTCT used serves to ensure that the mean-value filter processes the correct signal values. The run-in detector RI-DTCT searches in a search window, governed by the timer TIMING, for the start of the run-in signal. This is done by comparing the amplitude differences of the input values and the black level with a predetermined threshold. The first two adjacent input values within the search window that exceed the threshold are regarded as being associated with the run-in signal. When the run-in signal is found, the threshold estimator LVEST calculates the mean value for the samples, preferably in the middle of the run-in signal.

Figure 6:
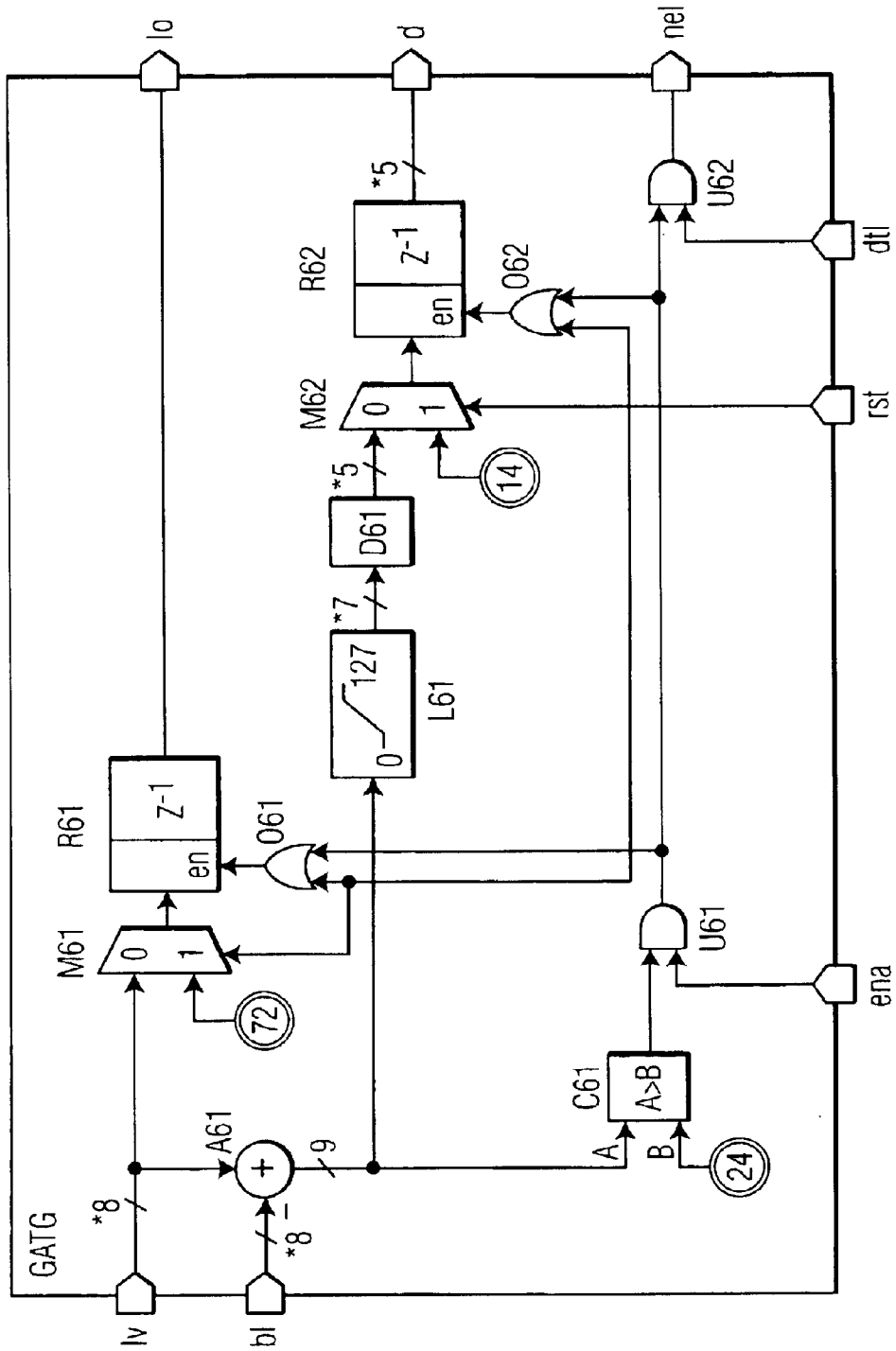
FIG. 6 shows a decision device.

FIG. 6 shows a decision device GATG. A first input lv supplies the information about the threshold to an adder A61 and to a 0-input of a multiplexer M61, whose second input. has a constant 72 applied to it. A second input bl supplies the information about the black level to the adder A61. The output of the adder A61 is connected to an A-input of a comparator C61 and to a limiter L61. The second input of the adder A61 has a constant 24 applied to it. The output of the adder A61 is connected to one input of an AND gate U61, and the second input of the AND gate U61 is connected to an input ena, which supplies the enable signal. The output of the multiplexer M61 is connected to a register R61 whose output lo is at the value for the level. This value is 72 for a normal Teletext line, for example.

The output of the limiter L61 is connected via a divider D61, the 0-input of a multiplexer M62 and a register R62 to an output d, which gives a divider output signal. The 1-input of the multiplexer M62 has a constant 14 applied to it. The control inputs of the multiplexers M61, M62, one input of an OR gate O61 and one input of an OR gate 062 are connected to an input rst of the decision device GATG, to which the external reset signal is applied. The output of the AND gate U61 is connected to a second input of the OR gate O61, to a second input of the OR gate O62 and to one input of an AND gate U62, whose second input has the signal dtl from the timer TIMING connected to it. An output nel of the AND gate U62 provides a pulse for the register REG3.

The decision device GATG checks the estimate lv supplied by the threshold estimator LVEST if it is indicated by the signal ena to be a valid estimation. If the estimate lv exceeds a predetermined threshold, e.g. 24, it is assumed that a data line-has been found that is not empty. A signal nel is then provided, to set the register REG3 to allow adaptation of the adaptive equalizer ADEQ. At the same time, the store contents of the two registers R61, R62 for the level value are renewed for the subsequent clamping circuit or scaling device, respectively.

Figure 7:
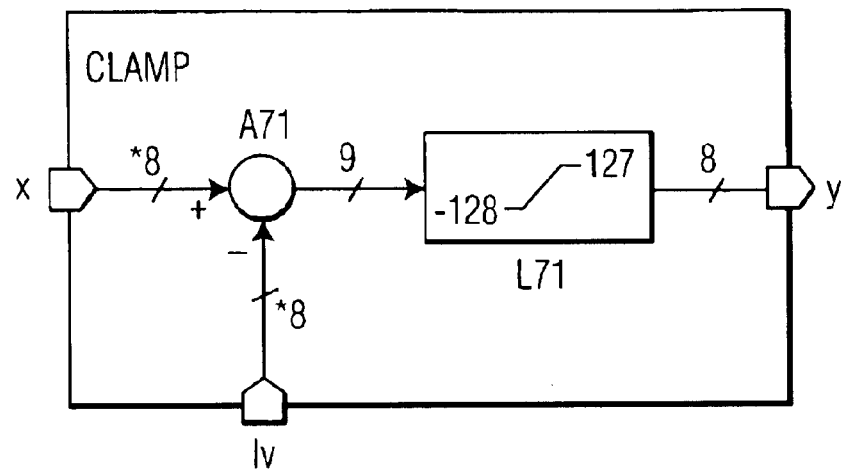
FIG. 7 shows a clamping circuit.

FIG. 7 shows an exemplary embodiment of the clamping circuit CLAMP. The input signal x from the delay circuit V11 is fed to an adder A71 whose negative input has the signal lv from the multiplexer M14 applied to it. The two input data lines are unsigned 8-bit lines. The output data line is a signed 9-bit line and is connected to a limiter L71. The output data line is a signed 8-bit line and is connected to an output y of the clamping circuit CLAMP.

Figure 8:
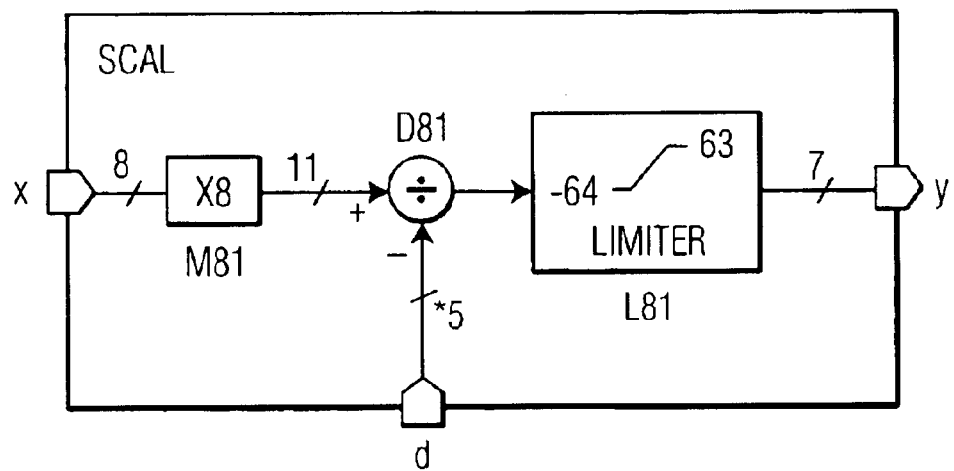
FIG. 8 shows a scaling device.

FIG. 8 shows an exemplary embodiment of the scaling device SCAL. The input signal x supplied by the clamping circuit CLAMP is fed to a multiplexer M81, whose output signal is divided in a divider D81 by the value d supplied from the input d. For a normal Teletext line, the magnitude is preferably set to 14. The output of the divider D81 is connected to an input of a limiter L81, whose 7 signed bit lines are connected to an output y of the scaling device SCAL.

Figure 9:
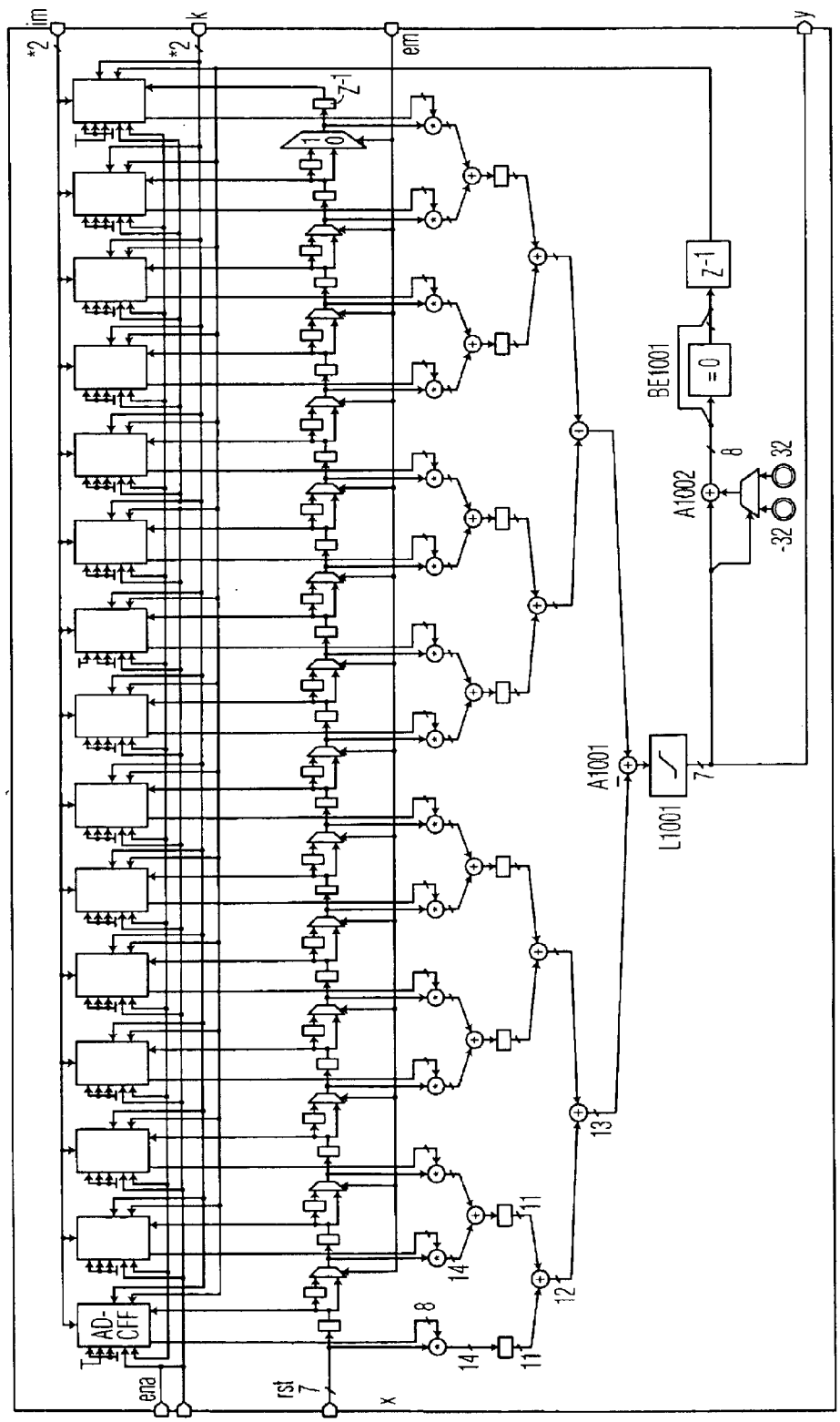
FIG. 9 shows an adaptive equalizer.
Figure 10:
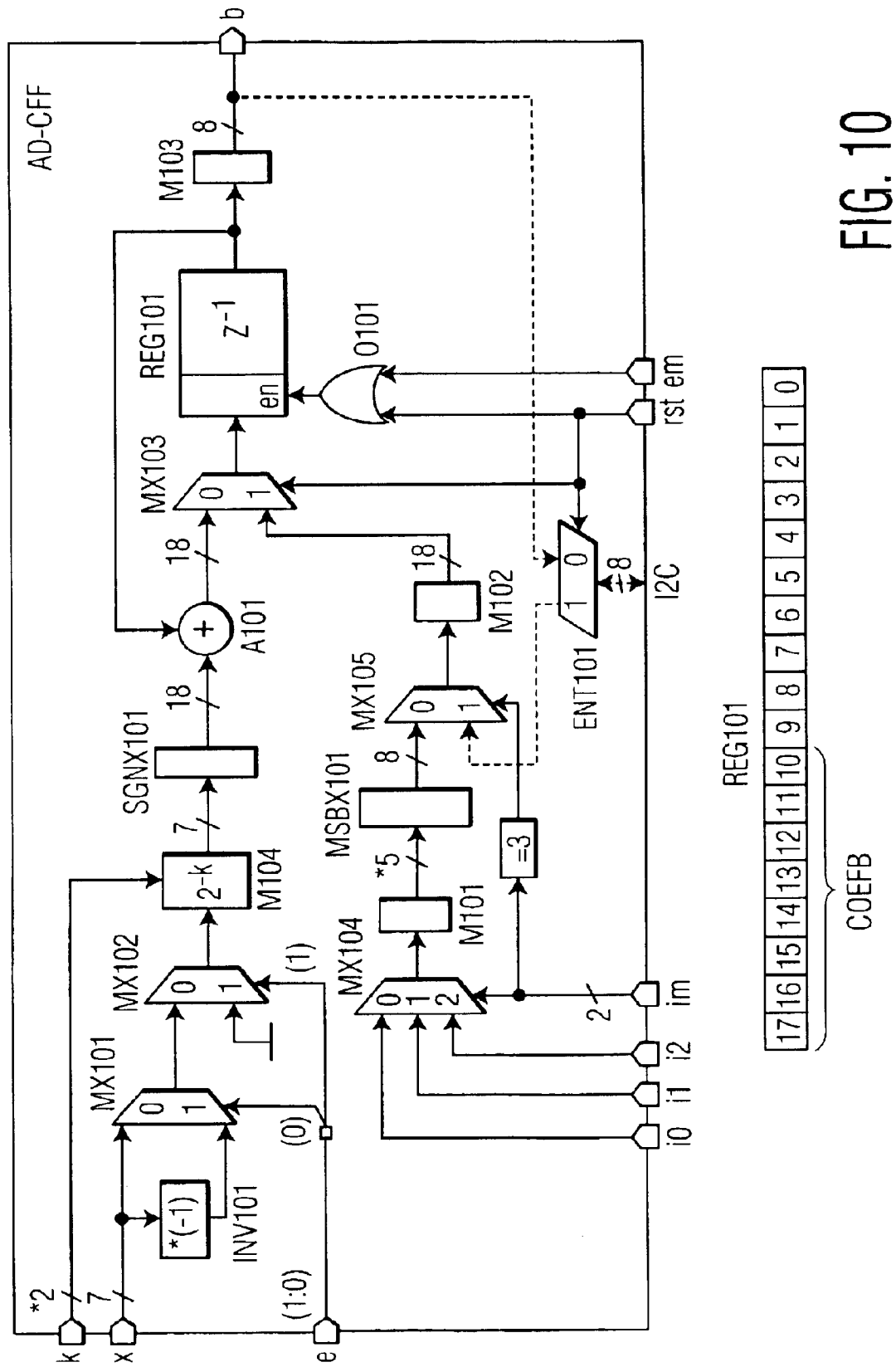
FIG. 10 shows a unit for coefficient adaptation.

FIG. 9 shows an exemplary embodiment of the adaptive equalizer ADEQ, which contains 15 units AD-CFF for coefficient adaptation, as illustrated in detail in FIG. 10. A unit for coefficient adaptation AD-CFF has an input x and an output b, as well as an enable signal en, an input k for predetermined adaptation constants, an input e, an input rst for a reset signal, an input em for an operating mode and an I2C input I2C for an external drive. The input x is connected to a 0-input of a multiplexer MX101 via a signed 7-bit line, and to a 1-input of the multiplexer MX101 via an invertor INV101. The output of the multiplexer MX101 is connected to a 0-input of a multiplexer MX102, whose 1-input is connected to earth. Control lines for the two multiplexers MX101, 102 are connected to the input e, the multiplexer MX101 being switched by a value 0 and the multiplexer MX102 being switched by a value 1. The output of the multiplexer MX102 is connected to an adder A101 via a multiplier M104, whose coefficient is set by the input k, and via a sign-adding device SGNX101. The output of the adder A101 is on the one hand fed back, via the 0-input of a multiplexer MX103 and a register REG101, to a second input of the adder A101, and is also fed to the output b via a multiplier M103.

A multiplexer MX104 has coefficients i0, i1, i2 of an initialization mode applied to its inputs 0, 1, 2, for internal initialization, and a coefficient im of an initialization mode is applied to its control input, for external initialization. The output of the multiplexer MX104 is connected via a multiplier M101, an MSB-adding device MSBX101, the 0-input of a multiplexer MX105 and a multiplier M102 to the 1-input of the multiplexer MX103. If the coefficient im assumes the value "3", a "1" is supplied to the control input of the multiplexer MX105. The I2C input is connected to the 1-input of the multiplexer MX105 via a decision-maker ENT101. The output b is connected to the 0-input of the decision-maker ENT101. A control input of the decision-maker ENT101 and of the multiplexer MX103 as well as, via an OR gate O101, an enable input en for the register REG101 are connected to the input rst. The input em is connected to a second input of the OR gate O101.

The algorithm for coefficient adaptation can be calculated as follows:

$$b_i(n)=b_i(n-1)+e(n-1)*x(n-1)*2^{-k-11}, i=0,1,2, \quad (14)$$

where $$e(n) = \begin{cases} SIGN(32-y(n)), & y(n) \geq 0 \\ SIGN(-32-y(n)), & y(n) < 0 \end{cases}$$

in which $$SIGN(\xi) = \begin{cases} -1, & \xi < 0 \\ 0 & \xi = 0 \\ 1 & \xi > 0 \end{cases}$$

and k=0,1,2,3 is a user option, which can be called an adaptation constant.

To set up the algorithm, an 18-bit register REG101 is required for every tab. Such a register is called a tab register here. The 8 MSBs are called coefficient bits and are used as filter coefficients, whilst the whole register REG101 is used as a store for the adaptation. The 8 coefficient bits of each tab register REG101 can preferably be read from or written to by an external processor using an I2C bus.

The coefficients can be reset to their initialization value if a signal rst is set.

In preference, 4 modes are provided to initialize the filter coefficients. The first 3 are internal. The predetermined initialization coefficients for these 3 internal modes can preferably be as follows:

{$b_0(0), b_1(0), \ldots, b_{14}(0)$}={0,0,0,0,0,0,0,16,0,0,0,0,0, 0,0} (internal mode 0), {16,0,0,0,0,0,0,0,0,0,0,0,0,0,0} (internal mode 1), or {0,0,0,0,0,0,0,0,0,0,0,0,0,0,16} (internal mode 2).

The fourth mode is provided for external initialization coefficients, which are loaded into the 8 coefficient bits of each tab register REG101 using an I2C bus.

Figure 11:
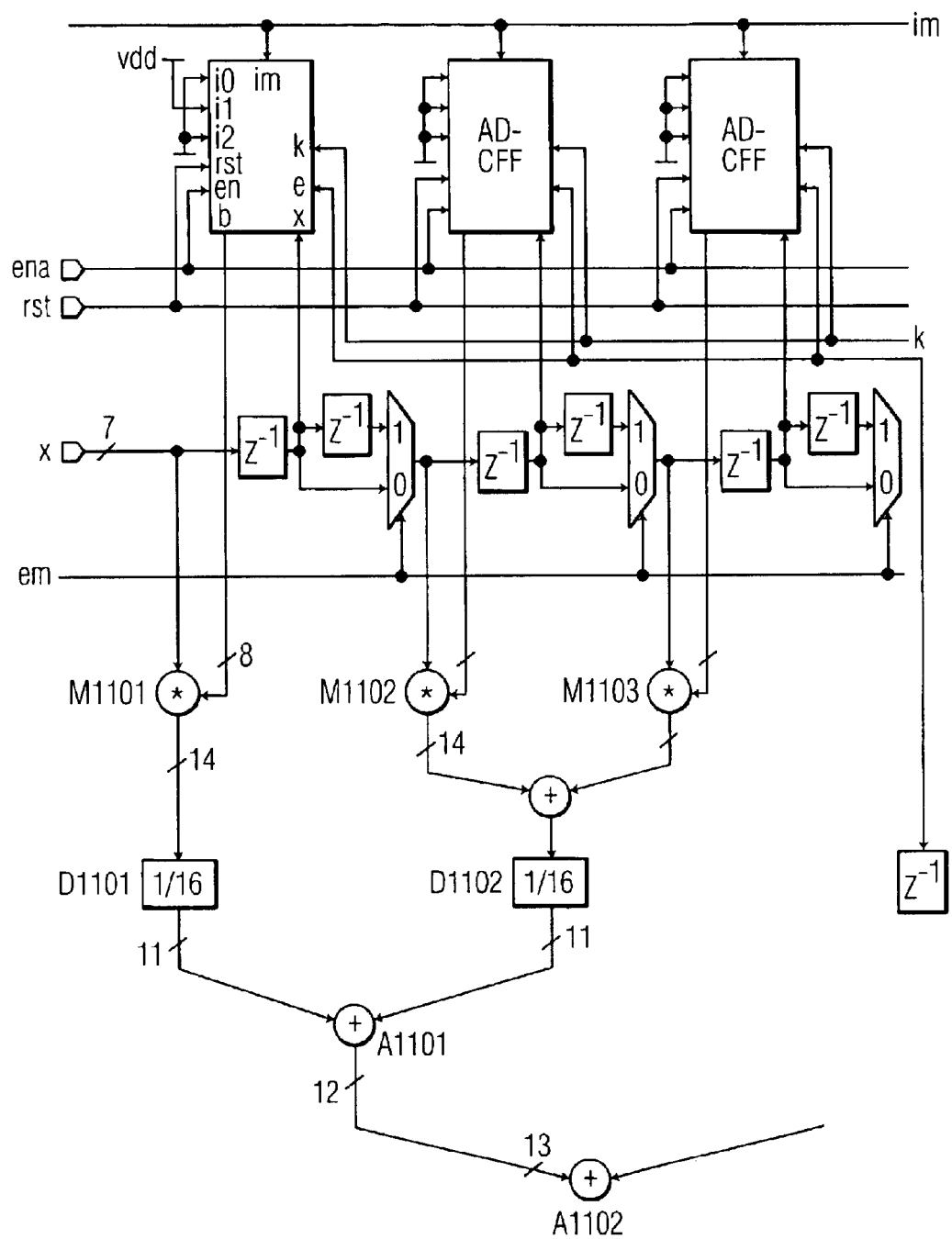
FIG. 11 shows a detail of the adaptive equalizer.

FIG. 11 shows a detail of the adaptive equalizer ADEQ, showing the units for coefficient adaptation AD-CFF. The input x is on the one hand connected to the x-input of the first unit AD-CFF via a delay stage, and then further to the x-input of the next unit AD-CFF via a respective network comprising a delay stage, a multiplexer and a further delay stage. In total, 15 units AD-CFF are used in this exemplary embodiment. The input x is connected firstly to a multiplier M1101 and then subsequently to further multipliers M1102, M1103 etc., in each case after the multiplexer of each network. The multiplexers of the networks are jointly connected to the input em by their control inputs. Each b-output of the 15 units AD-CFF is connected to the second input of each of the multipliers M1101, M1102, M1103 etc. Adding means A1101, A1102 connect together the outputs of the multipliers M1101, M1102, M1103 etc. The output of the last adder A1001 is connected to a limiter L1001 (see FIG. 9), which limits the signal in the range −64/63. The output signal from the limiter L1001 is passed on the one hand to the output y of the adaptive equalizer ADEQ and via an adder A1002, whose second input has a constant −32/32 applied to it which is determined by the sign of the output signal from the limiter L1001. The output is connected to the e-input of the units AD-CFF via a range decision-maker BE1001, a 0-value detector and a delay element.

Figure 12:
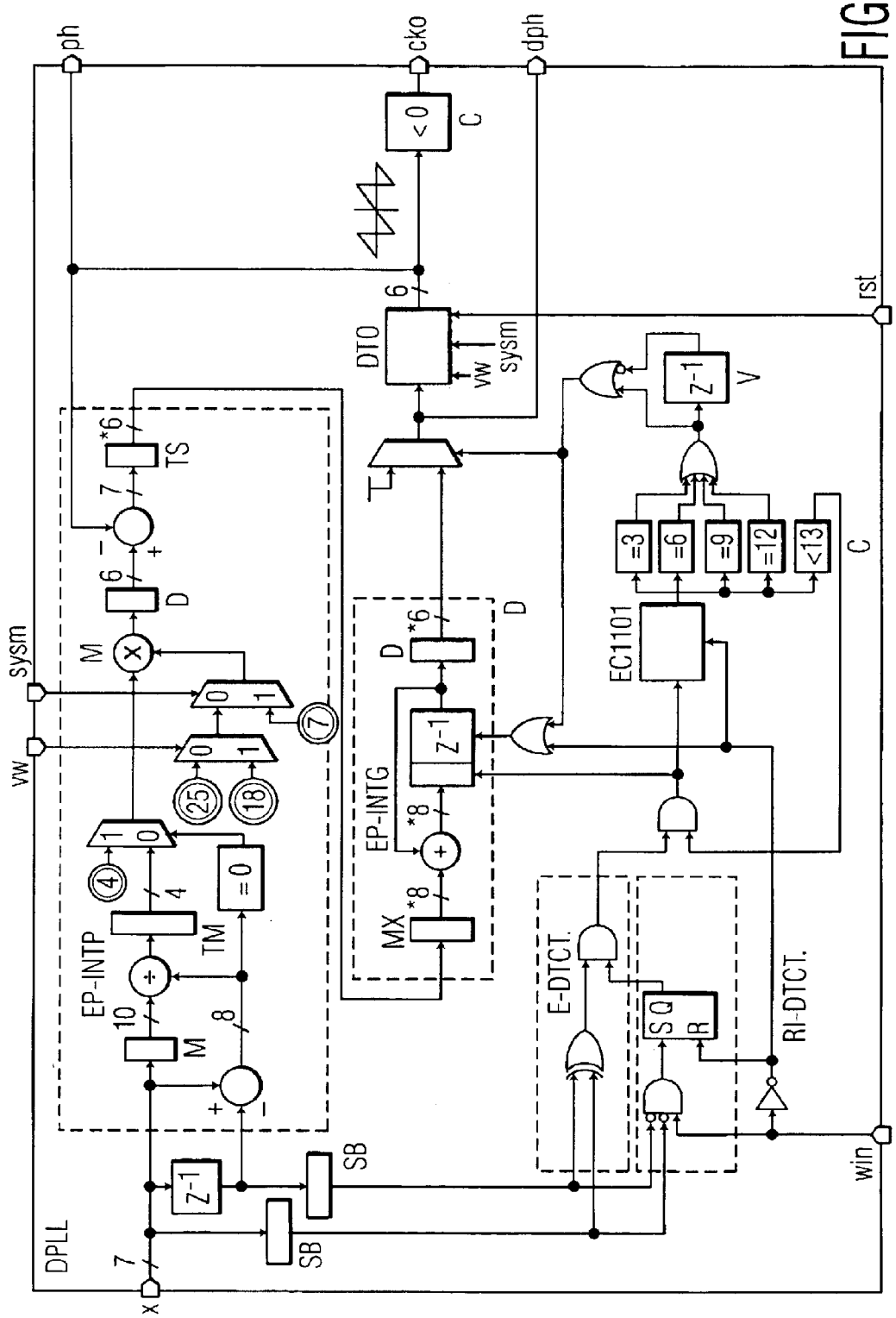
FIG. 12 shows a bit clock generator.

FIG. 12 shows a bit clock generator DPLL. The bit clock generator DPLL essentially comprises an edge detector E-DTCT, a run-in detector RI-DTCT, an edge integrator EP-INTG, an edge interpolator EP-INTP, a discrete time oscillator DTO and an edge counter EC1101. Other components are circuits SB for removing the sign bit, an MSB-adding circuit MX, multipliers M, an MSB truncation circuit TM and dividers D, which reduce the data in accordance with the bit length shown.

The bit clock generator DPLL is used to produce a clock signal cko, which is not only at the same frequency as the input signal but also has an exact phase angle, in order to sample the input signal again. The optimum phase angle for resampling is taken as being the rising edge of the clock signal cko or the falling edge of the discrete time oscillator DTO at the output ph as a mean value of the input symbol. The discrete time oscillator DTO, which generates a phase signal ph, accurate to 6 bits, for the input signal, should be regarded as being an important part of the bit clock generator DPLL. The frequency is switched by the control signals vw and sysm on the basis of the different data types and systems, as shown in the following table.

| sysm | vw | DTO frequency | Explanation |
|---|---|---|---|
| 0 | 0 | 6.9375 MHz | Bit rate for Teletext |
| 0 | 1 | 5.0 MHz | Bit rate for VPS/WSS |
| 1 | 0 | 1.007 MHz | Bit rate for closed caption/Gemstar |
| 1 | 1 | — | not permitted |

Figure 13:
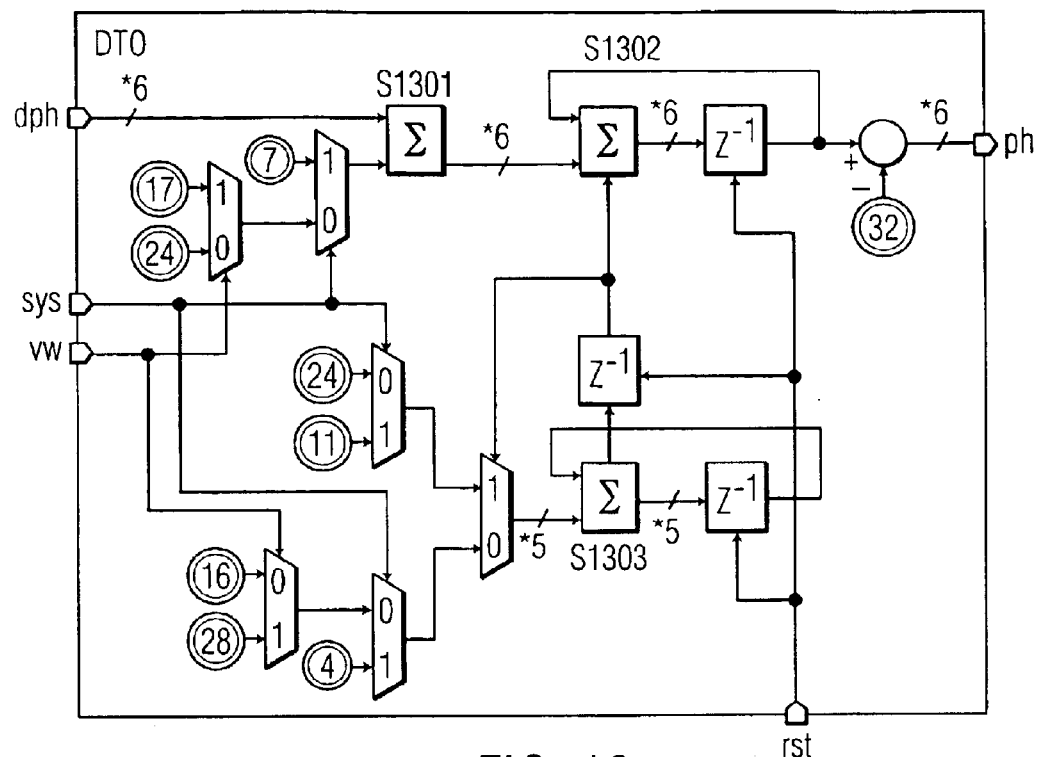
FIG. 13 shows a discrete time oscillator.

FIG. 13 shows a discrete time oscillator DTO having an input dph, an output ph and control inputs sys, vw and rst.

The control inputs sys, vw are connected to multiplexers which, on the basis of the appropriate operating parameters in the table shown above, provide the values indicated as a preference in the figure. In the signal part, the input signal dph is added in the summation circuit S1301 to the value provided by the multiplexer and is passed to a second summation circuit S1302, whose output signal, passed through a delay element, is on the one hand fed back to the summation circuit S1302 and on the other hand supplies the output signal from the discrete time oscillator DTO reduced by a value of 32.

The lower part of FIG. 13 shows multiplexers whose constant input values are selected on the basis of the appropriate operating parameters in the table shown above and are supplied to a summation circuit S1303. The summation circuit S1303 is connected in the same way as the summation circuit S1302 but has a second output, which is connected to a third input of the summation circuit S1302 via a delay element.

Figure 14:
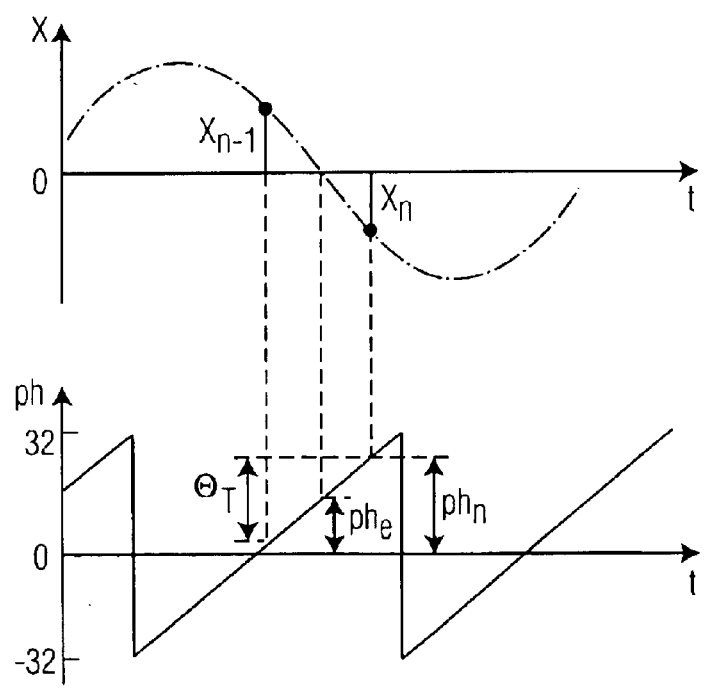
FIG. 14 shows an estimation of a phase error.

The discrete time oscillator DTO can be set by a phase correction pulse which has a value range from 0 to 63. The output phase can thus be changed by $dph*\pi/32$ for $dph<32$, or $(dph-64)*\pi/32$. In order to lock the phase of the time oscillator DTO to that of the input signal, it is necessary to check the phase error, this is to say the phase value at the zero crossing of the input value x, $ph_e$, as shown in FIG. 14. The value $ph_e$ is estimated using the equation:

$$ph_e = ph_n - \frac{\Theta_t \cdot x_n}{x_n - x_{n-1}},$$

where $x_n$ and $x_{n-1}$ are samples on both sides of the edges and $ph_n$ is the phase value for the discrete time oscillator DTO at $x_n$. $\Theta_T$ is a constant for a given frequency, e.g. the phase difference for one sample interval.

After a modulo operation with (−64:−33, −32:31, 32:63) →(0:31, −32:31, −32:−1), a value conversion from (−32:−1, 0:31)→(32:63, 0:31) and an integration operation, the inverse value of the phase error is taken as the phase correction value and is fed to the discrete time oscillator DTO. In this exemplary embodiment, interpolation is carried out for two successive input values in each case.

Phase correction is preferably carried out only for the run-in signal of one data line. The correction circuit is deactivated after 4 pulses have been fed to the discrete time oscillator DTO; this happens after 12 edges have been detected, for example. The edge counter EC1101, which is started by the run-in detector RI-DTCT, is used to monitor the integration interval, the keying of the phase correction circuit, and the number of corrections.

Figure 15:
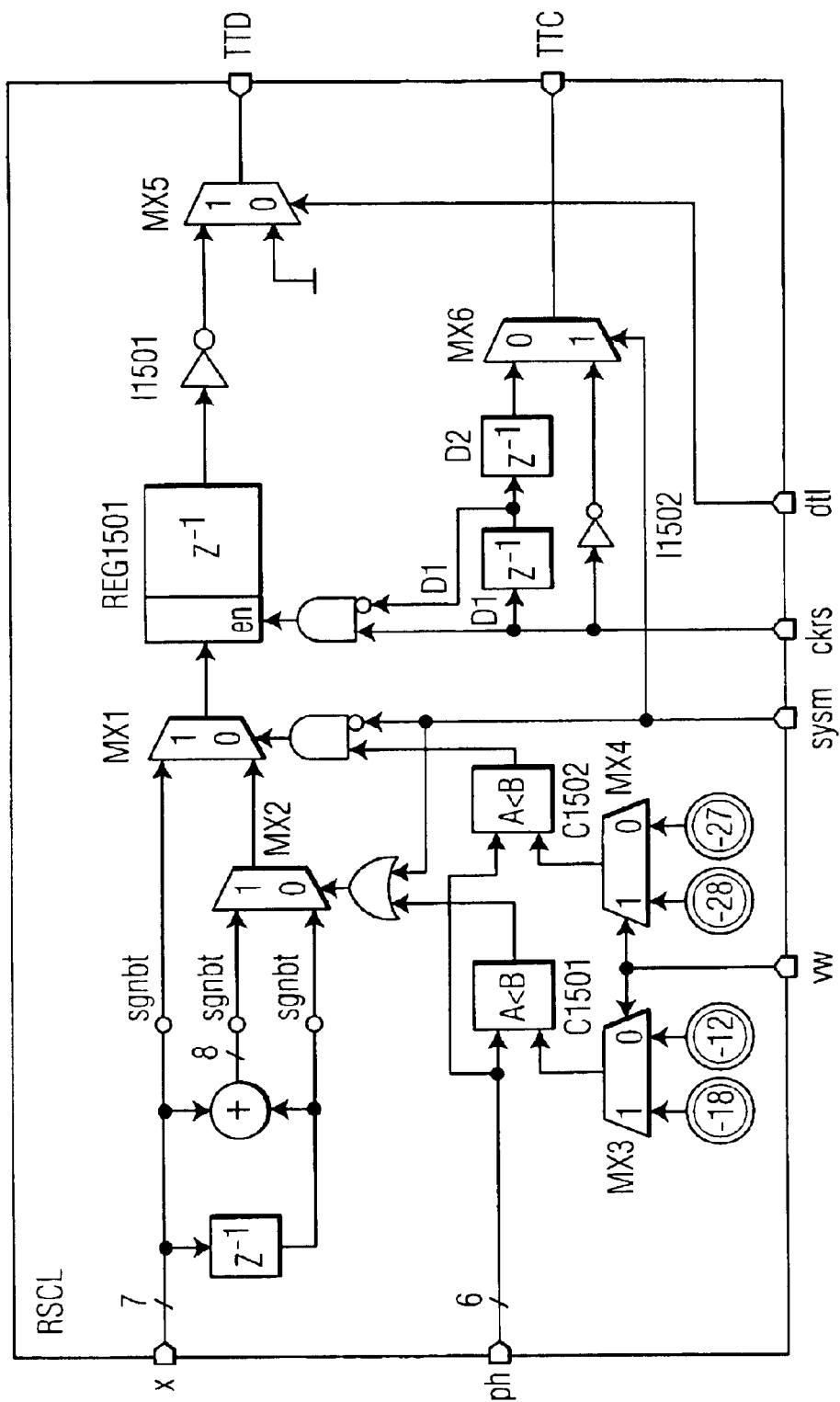
FIG. 15 shows a data rate converter.

FIG. 15 shows an exemplary embodiment of a data rate converter RSCL. A respective sign sgnbt is fed from an input x directly and indirectly via a delay element and an adder to a multiplexer network MX1, MX2 and then to a register REG1501, whose output signal is produced at the output TTD, having passed through an invertor I1501 and a multiplexer MX5. A circuit arrangement in a respective comparator C1501, C1502 is used to compare the signal ph from the discrete time oscillator DTO with output values from multiplexers MX3, MX4, which provide a value derived from their input value. The multiplexers MX3, MX4 are controlled by the signal vw. The multiplexers MX1, MX2 are switched depending on the output value from the comparators C1501, C1502 and on the control signal sysm. A network comprising delay elements D1, D2, an invertor I1502 and a multiplexer MX6 is used to produce the output signal TTC from the signal ckrs under the control of the signal sysm. The multiplexer MX5 is controlled by the signal dtl.

What is claimed is:

1. Circuit arrangement for recovering a digital signal which is transmitted in a TV signal, wherein a signal corresponding to the transmitted digital signal is fed to a threshold decision-maker and a clamping circuit wherein output signals of the threshold decision-maker and the clamping circuit are fed to a self-adaptive equalizer, wherein the filter coefficients of the self-adaptive equalizer are adapted by calculating an algorithm using preceding input samples and preceding filter coefficients, and that output signals of the self-adaptive equalizer are fed to a data rate converter and a bit generator which controls the data rate converter.

2. Circuit arrangement according to claim 1, wherein the clamping circuit has a delay circuit connected upstream.

3. Circuit arrangement according to claim 1, wherein the threshold decision-maker is connected to a decision device for detecting lines which contain data.

4. Circuit arrangement according to claim 3, wherein a black-level estimator is connected both to the threshold decision-maker and to the decision device.

5. Circuit arrangement according to claim 3, wherein an output of the threshold decision-maker is connected to a scaling device preferably via the decision device, and this scaling device carries out amplitude normalization depending on the result of the difference between a black level and a reference value, which are provided by the decision device and the scaling device.

* * * * *